(12) United States Patent
Koide

(10) Patent No.: US 7,099,173 B2
(45) Date of Patent: Aug. 29, 2006

(54) STACKED LAYERED TYPE SEMICONDUCTOR MEMORY DEVICE

(75) Inventor: Yasunori Koide, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 31 days.

(21) Appl. No.: 11/038,532

(22) Filed: Jan. 21, 2005

(65) Prior Publication Data
US 2005/0162950 A1    Jul. 28, 2005

(30) Foreign Application Priority Data
Jan. 21, 2004    (JP) .............................. 2004-013576

(51) Int. Cl.
*G11C 5/02* (2006.01)
(52) U.S. Cl. ............................. 365/51; 365/52; 365/63; 365/145; 257/759
(58) Field of Classification Search ................... 365/51, 365/52, 63, 145; 257/759
See application file for complete search history.

(56) References Cited

U.S. PATENT DOCUMENTS 5,561,622 A * 10/1996 Bertin et al. .................. 365/51
6,355,976 B1 * 3/2002 Faris .......................... 257/686
6,894,392 B1 * 5/2005 Gudesen et al. ............. 257/759
2004/0257847 A1 * 12/2004 Matsui et al. .................. 365/63

FOREIGN PATENT DOCUMENTS

JP    A 05-063138    3/1993

* cited by examiner

*Primary Examiner*—Huan Hoang
(74) *Attorney, Agent, or Firm*—Oliff & Berridge, PLC

(57) ABSTRACT

To provide laminated type semiconductor memory devices that can improve the yield of chips without complicating wirings and components. There are provided a plurality of laminated semiconductor chip layers, and chip selection pads provided on each of the chip layers, which are mutually connected across the chip layers, respectively, such that a chip selection signal for selecting each of the chip layers is commonly inputted in each of the chip layers. Each of the chip layers is equipped with program circuits each of which is capable of programming an output signal, and a chip selection judging circuit that judges a chip selection based on the chip selection signal and an output signal of the program circuit. The program circuit is equipped with writable nonvolatile memory cells, and a logical circuit that is connected to the nonvolatile memory cells and outputs a signal that is different depending on a recoded content in the nonvolatile memory cells, such that a step of melting fuses is not necessary.

9 Claims, 5 Drawing Sheets

STACKED LAYERED TYPE SEMICONDUCTOR MEMORY DEVICE

BACKGROUND

The present invention relates to semiconductor memory devices such as ferroelectric memory devices, and more particularly to a packaging technology in which a plurality of semiconductor chips are laminated, thereby achieving a three-dimensional mounting to multiply a per area memory capacity by the number of layers of the laminated chips, and a technology that makes it possible to optionally select each of the chip layers.

Laminating a plurality of semiconductor chips is known to make a semiconductor integrated circuit to have a higher density. In order to drive the laminated semiconductor chips, it is necessary to provide a structure for selecting as to which one of the chips in the layers is made active. For example, Japanese Laid-open Patent Application HEI 5-63138 describes a structure in which one ends of lead lines are connected to semiconductor chips laminated on a carrier substrate, respectively, and the other ends of the lead lines are connected to conductive pins provided standing on the carrier substrate.

[Patent Document 1] Japanese Laid-open Patent Application HEI 5-63138.

SUMMARY

However, the structure described in the aforementioned Japanese Laid-open Patent Application HEI 5-63138 is complex because the laminated chips need to be connected individually to the lead lines and the conductive pins, respectively, which increase the number of wirings and the number of components.

To avoid such problem, each of the chips may be provided with a structure that can be discriminated from the other chips. However, to discriminate the chips one from the other, different kinds of chips need to be manufactured. In this case, there is problem, that is, a lack of economy, because different metal masks are required for manufacturing different chips, and if the yield of chips only in one type is lower, the other chips may remain as excesses.

It is an object of the present invention to solve the problems of the conventional technology described above, and provide laminated type semiconductor memory devices that can improve the yield of chips without complicating wirings and components.

To solve the problems described above, a semiconductor memory device in accordance with the present invention pertains to a semiconductor module device having a plurality of semiconductor chip layers laminated, and is equipped with a chip selection pad provided on each of the chip layers, the chip selection pads mutually connected across the chip layers such that a chip selection signal for selecting each of the chip layers is commonly inputted in each of the chip layers. Each of the chip layers is equipped with a program circuit equipped with a writable nonvolatile memory cell, and a logical circuit that is connected to the nonvolatile memory cell and outputs a signal that is different depending on recoded content in the nonvolatile memory cell, and a chip selection judging circuit that judges a chip selection based on the chip selection signal and an output signal of the program circuit.

By recording in the program circuit, addresses for selecting chips can be set, such that different chips do not need to be manufactured for different stages of chips, and therefore the yield of chips increases. Also, because the nonvolatile memory cell is used, a step of melting fuses can be made unnecessary.

In the semiconductor memory device described above, the nonvolatile memory cell may preferably be capable of rewriting the recorded content after writing the same. Because a recorded content written can be rewritten afterward, a waste of chips due to writing by mistake can be eliminated.

In the semiconductor memory device described above, the program circuit may preferably be equipped with a flip-flop having a first terminal and a second terminal, a first ferroelectric capacitor that gives a first capacity to the first terminal, a second ferroelectric capacitor that gives a second capacity different from the first capacity to the second terminal, and a voltage source that supplies a drive voltage for driving the flip-flop to the flip-flop in which the first capacity and the second capacity are given to the first terminal and the second terminal. By this, reading becomes possible by using a nonvolatile memory cell with a simple structure.

In the semiconductor memory device described above, each of the chip layers is equipped with a control circuit that detects a starting of a power supply and controls a signal output from the first terminal or the second terminal of the flip-flop. By this, reading becomes possible without separately generating a signal to start the control circuit.

In the semiconductor memory device described above, each of the chip layers may preferably be equipped with a plurality of the chip selection pads and a plurality of the program circuits, and may preferably be further equipped with a programming pad that receives a write control signal for writing in the nonvolatile memory cell. Each of the program circuits may preferably be equipped with a write data receiving terminal that receives data to be recorded in the nonvolatile memory cell, and a write control signal receiving terminal that receives the write control signal from the programming pad, wherein the plurality of the chip selection pads may preferably be connected to the write data receiving terminals of the plurality of program circuits, respectively.

By inputting a signal from the chip selection pad to the data receiving terminal at the time of writing in the program circuit in a manner described above, external terminals for writing do not have to be increased even when a plurality of program circuits are provided.

In the semiconductor memory device described above, each of the chip layers may preferably be equipped with a control device that detects the write control signal from the programming pad and executes a control to write in the nonvolatile memory cell. By this, writing to the program circuit can be controlled without separately generating a signal to start the control circuit.

In the semiconductor memory device described above, each of the chip selection pads may preferably be connected to the write data receiving terminal via a logical product circuit formed with the control signal from the programming pad. By this, the chip selection signal is prevented from being inputted in the write data receiving terminal except the time of writing, such that the power consumption can be reduced.

In the semiconductor memory device described above, each of the chips may preferably be further equipped with a second chip selection judging circuit, and the programming pad may preferably be connected to the control signal receiving terminal through a logical product circuit formed with the second chip selection judging circuit. By this, even after chips are laminated and mounted, data in the program circuit can be rewritten.

An electronic apparatus in accordance with the present invention is characterized in comprising the semiconductor memory device recited above. For this reason, an electronic apparatus equipped with a memory means having a small area and a large capacity can be provided at low costs.

BRIEF DESCRIPTION OF THE DRAWINGS

FIG. 5*a* and FIG. 5*b*, is a timing chart indicating operations of the program circuit in FIG. 4;

DETAILED DESCRIPTION OF EMBODIMENTS

Next, embodiments of the present invention are described with reference to the accompanying drawings.

1. First Embodiment

Figure 1:
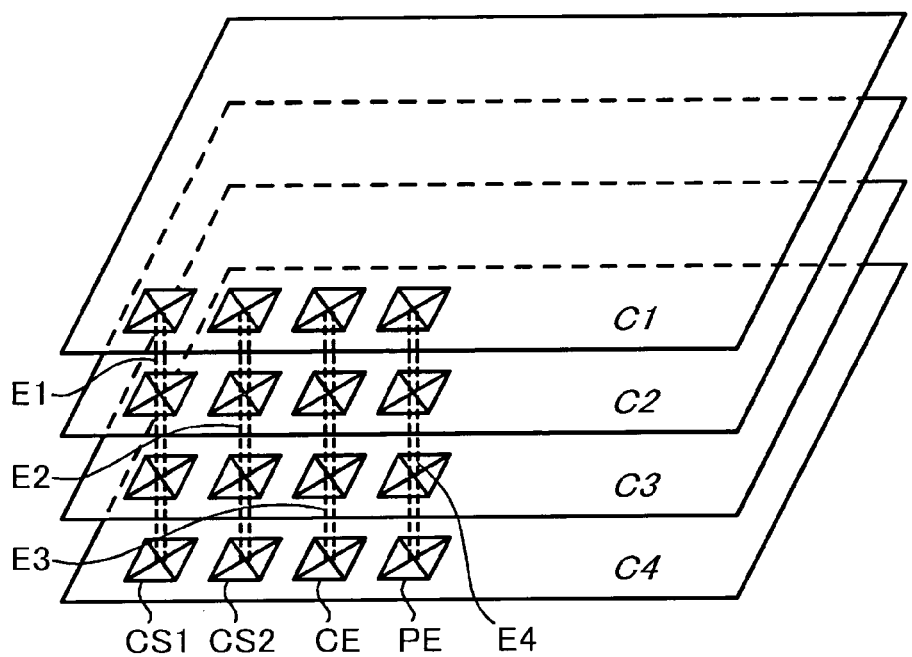
FIG. 1 is a schematic perspective view of a laminated type semiconductor memory device in accordance with a first embodiment of the present invention.

FIG. 1 is a schematic perspective view of a three-dimensional mounting, which is an example of a laminated type semiconductor memory device in accordance with a first embodiment of the present invention. The semiconductor memory device includes laminated four identical memory cell array chips C1–C4, so that a four-fold memory capacity per area can be obtained. The chips C1–C4 correspond to chip layers in accordance with the present invention.

On each of the chips C1–C4, a plurality of chip selection pads CS1, CS2, a chip enable pad CE and a programming pad PE are formed. Also, though not illustrated in FIG. 1 for simplification, other pads necessary for memory operations, such as, for example, pads for addresses and I/O, control pads and the like are also formed. The number of the chip selection pads can be designed optionally according to the number of chips to be laminated. In the chips C1–C4, all of the corresponding pads required for memory operation and chip selection of the present invention in all of the chips are mutually, electrically connected by electrodes that penetrate the pads, respectively, such that the same signals can be inputted, respectively. In other words, a part of the chip selection signal is inputted in the chip selection pads CS1 of the respective chips, another part of the chip selection signal is inputted in the chip selection pads CS2 of the respective chips, and a chip enable signal is inputted in the chip enable pads CE of the respective chips. It is noted that, because the programming pads are not used after lamination in accordance with the present embodiment, and therefore they may not have to be connected by an electrode wire E4, or may be grounded.

Figure 2:
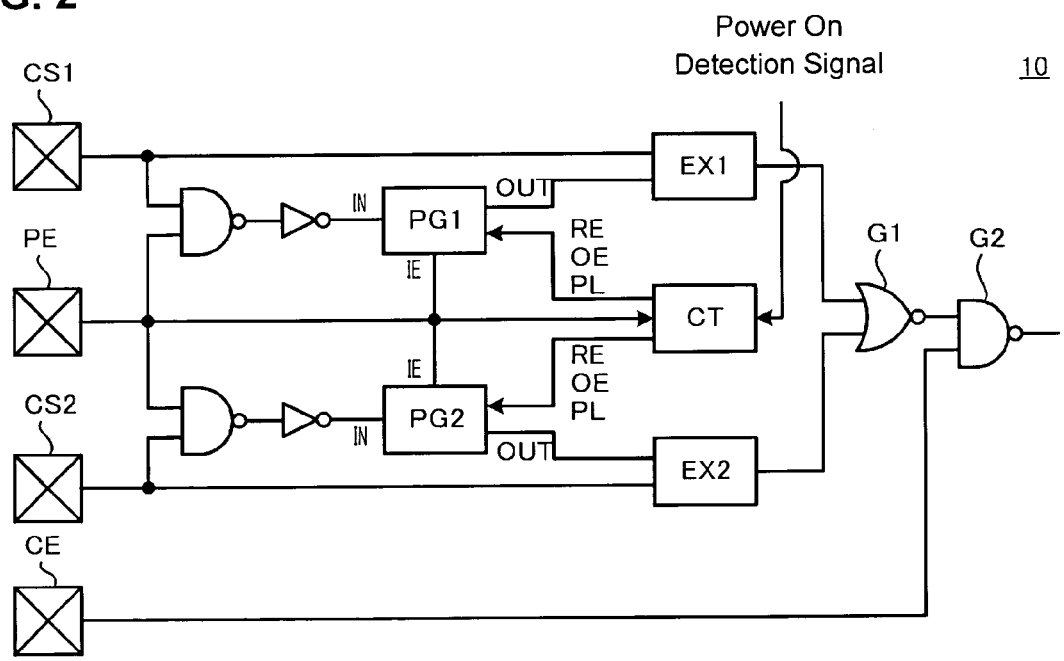
FIG. 2 is a circuit diagram of a chip selection judging circuit 10 provided on each chip.

On each of the chips C1–C4, a chip selection judging circuit to be described below with reference to FIG. 2 is formed, and the chip selection judging circuit is connected to the pads CS1, CS2, CE and PE in each of the chips.

The chips C1–C4 described above are identical chips, and due to the fact that the chip selection pads and the chip selection judging circuits are provided thereon, there is no need to manufacture chips with connections modified for individual stages of the laminated layers. Due to the fact that addresses for selecting the chips may be programmed afterwards, after chips of one kind are manufactured and examined for quality products, the problems, such as, the yield of chips of a specified type being poor, chips of a specified type running short, and the like, can be eliminated.

2. Chip Selection Judging Circuit

FIG. 2 shows a circuit diagram of a chip selection judging circuit 10 provided on each of the chips. The chip selection judging circuit 10 judges, based on a chip selection signal inputted in the chip selection pads CS1, CS2, as to whether or not the corresponding chip is selected.

The chip selection judging circuit 10 is equipped with program circuits PG1, PG2 that are capable of programming output signals. The number of the program circuits corresponds to the number of the chip selection pads CS1, CS2. Write data IN and write control signal IE are inputted in input terminals of the program circuits PG1 and PG2, based on signals received at the respective pads. Also, a connection control signal RE, read control signal OE, storage control signal PL are inputted from a control circuit CT on each of the chips. Details of the program circuits PG1, PG2 are described below with reference to FIG. 4.

The chip selection judging circuit 10 is further equipped with exclusive OR circuits EX1, EX2. A part of the chip selection signal inputted in the chip selection pad CS1 and an output OUT of the program circuit PG1 are inputted in one of the exclusive OR circuits, EX1. Similarly, another part of the chip selection signal inputted in the chip selection pad CS2 and an output OUT of the program circuit PG2 are inputted in the other of the exclusive OR circuits, EX2. Then, outputs of the exclusive OR circuits EX1 and EX2 are inputted in a NOR gate G1. Further, an output of the NOR gate G1 and a chip enable signal inputted in the chip enable pad CE are inputted in a NAND gate G2 in the last stage. An output of the NAND gate G2 is the last output from the chip selection judging circuit 10.

The exclusive OR circuits EX1 and EX2 each output a logical L when the signals from the chip selection pad CS1 and the program circuit PG1 match each other, and the signals from the chip selection pad CS2 and the program circuit PG2 match each other, respectively, and output a logical H when they do not match. Further, the NOR gate G1 outputs a logical H only when both of the outputs from the exclusive OR circuits EX1 and EX2 are at a logical L, and outputs a logical L when either of the outputs from the exclusive OR circuits EX1 and EX2 is at a logical H. Accordingly, only when the signals from the chip selection pads CS1 and CS2 and from the program circuits PG1 and PG2 completely match one another, the NOR gate G1 outputs a logical H.

The NAND gate G2 at the last stage outputs a signal corresponding to the chip enable signal only when the output of the NOR gate G1 is at a logical H, and outputs only a logical H regardless of the chip enable signal when the output of the NOR gate G1 is at a logical L. Accordingly, when the output of the NOR gate G1 is at a logical H, in other words, only when the signals received at the chip selection pads CS1 and CS2 and the signals from the program circuits PG1 and PG2 completely match one another, the chip enable signal becomes active in that chip.

In accordance with the present embodiment, by using two chip selection pads CS1 and CS2, a 2-bit chip selection signal can be designated. Therefore, by providing the chip selection judging circuit 10 that is equipped with two of such program circuits PG1 and PG2 on each chip, four types of chip selection signals can be identified. Accordingly, when four chips are laminated, they can be identified and any desired ones among them can be driven.

For example, if n (n is a natural number) chip selection pads CS1–CSn are used such that an n-bit chip selection signal can be designated, a chip selection judging circuit equipped with n program circuits PG1–PGn may be formed on a chip. The chip selection judging circuit in this case inputs (1) signals from the chip selection pad CS1 and the program circuit PG1, (2) signals from the chip selection pad CS2 and the program circuit PG2, . . . , and (n) signals from the chip selection pad CSn and the program circuit PGn in exclusive OR circuits EX1, EX2, . . . , and EXn, respectively. By inputting these outputs in one NOR gate G1, an n-bit chip selection signal can be identified. Accordingly, even when $2^n$ chips are laminated, any desired one of the chips can be driven.

Figure 3:
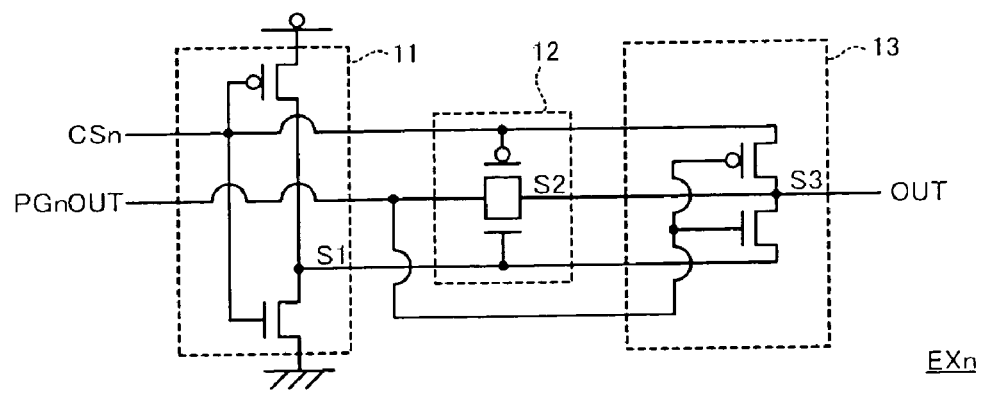
FIG. 3 is s a circuit diagram showing an example of a structure of an exclusive OR circuit formed MOS transistors, which is used in the chip selection judging circuit in FIG. 2.

FIG. 3 is a circuit diagram showing an example of a structure of the exclusive OR circuit formed with MOS transistors, which is used in the chip selection judging circuit. The exclusive OR circuit EXn outputs a logical L from an output terminal OUT only when inputs at an input terminal CSn and an input terminal PGnOUT match each other. More specifically, the exclusive OR circuit EXn is formed from a combination of a first NOT circuit 11, a transfer gate 12 and a second NOT circuit 13.

When an input signal CSn is received at gates of a p-MOS transistor and an n-MOS transistor that are connected in series, the first NOT circuit 11 outputs a logical NOT of CSn from an output terminal S1.

The transfer gate 12 receives the input signal CSn and the logical NOT of CSn (S1) at its gates of a p-MOS transistor and an n-MOS transistor that are connected in parallel, respectively, and receives an input signal PGnOUT at its source or drain. Accordingly, the transfer gate 12 outputs from an output terminal S2 a logical product of the logical NOT of CSn and the input signal PGnOUT.

The second NOT circuit 13 receives the input signal PGnOUT at gates of a p-MOS transistor and an n-MOS transistor that are connected in series, and receives the input signal CSn at a source or a drain on the p-MOS side, and the logical NOT of CSn on the n-MOS side, respectively. Accordingly, a logical product of a logical NOT of PGnOUT and the input signal CSn is outputted from an output terminal S3.

The output terminal S2 and the output terminal S3 are joined into an output OUT. Accordingly, the output OUT provides a logical H when signals on the input terminal CSn and the input terminal PGnOUT do not match each other, and a logical L when they match each other. By this, a matching state of the chip selection signal and the program circuit output can be judged.

Concrete structures of the exclusive OR circuit are not limited to the one described above, and variety of other circuit structures can be adopted.

3. Program Circuit

Figure 4:
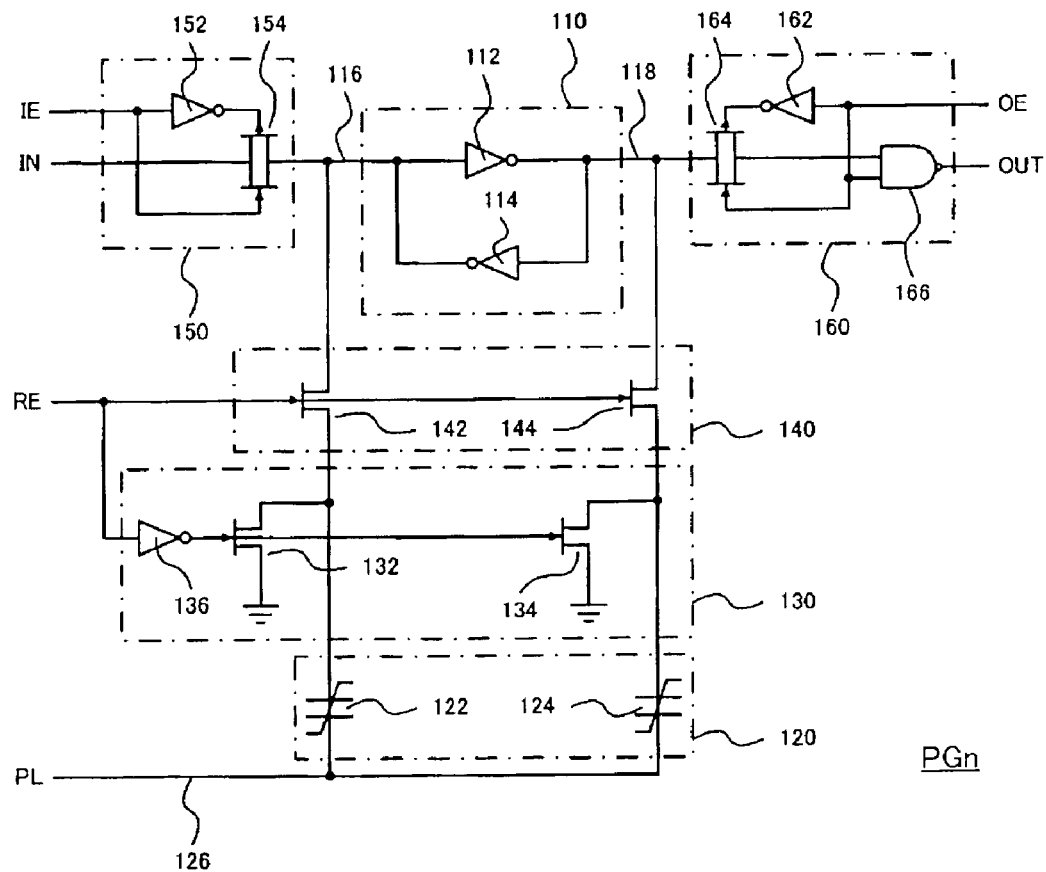
FIG. 4 is a circuit diagram indicating an example of a program circuit provided in the chip selection judging circuit in FIG. 2.

FIG. 4 is a circuit diagram indicating one example of a program circuit provided in the chip selection judging circuit in FIG. 2. A program circuit PGn is equipped with a flip-flop 110, a storage section 120, a discharge section 130, a connecting section 140, a writing section 150, and an output section 160. The program circuit PGn is a circuit that reads memory data stored in the storage section 120 that is a nonvolatile storage device, and writes the data in the flip-flop 110, to thereby supply the data externally as an output signal OUT.

The flip-flop 110 is composed of a first inverter 112 and a second inverter 114, and a first terminal 116 and a second terminal 118 that electrically connects the flip-flop 110 to external sections. Each of the first inverter 112 and the second inverter 114 has an input terminal and an output terminal, the output terminal of the first inverter 112 is electrically connected to the input terminal of the second inverter 114, and the output terminal of the second inverter 114 is electrically connected to the input terminal of the first inverter 112. Also, the input terminal of the first inverter 112 and the output terminal of the second inverter 114 are electrically connected to the first terminal 116, and the output terminal of the first inverter 112 and the input terminal of the second inverter 114 are electrically connected to the second terminal 118.

The storage section 120 is composed of a first ferroelectric capacitor 122 and a second ferroelectric capacitor 124. Each of the first ferroelectric capacitor 122 and the second ferroelectric capacitor 124 has one end and another end. The one end of the first ferroelectric capacitor 122 is formed to be electrically connectable to the first terminal 116, and the one end of the second ferroelectric capacitor 124 is formed to be electrically connectable to the second terminal 118. Also, the other end of the first ferroelectric capacitor 122 and the other end of the second ferroelectric capacitor 124 are electrically connected to a plate line 126.

Also, the first ferroelectric capacitor 122 and the second ferroelectric capacitor 124 store complementary data, such that the first ferroelectric capacitor 122 and the second ferroelectric capacitor 124 have mutually different capacities based on their paraelectric characteristics. Accordingly, when the flip-flop 110 and the storage section 120 are electrically connected, the first ferroelectric capacitor 122 gives a predetermined capacity to the first terminal 116, and the second ferroelectric capacitor 124 gives a capacity different from the predetermined capacity to the second terminal 118.

The discharge section 130 controls the potential on one ends of the first ferroelectric capacitor 122 and the second ferroelectric capacitor 124 based on the potential of a connection control signal RE, thereby bringing the potential on the one ends to be generally the same potential as the potential on the other ends. More specifically, the discharge section 130 brings the potential on one end of the first ferroelectric capacitor 122 and on one end of the second ferroelectric capacitor 124 to be generally the same potential as the potential on the plate line 126, thereby bringing the voltage that is applied to the first ferroelectric capacitor 122 and the second ferroelectric capacitor 124 to almost zero (0).

In the present embodiment, the discharge section 130 has a structure having n-type MOS transistors 132 and 134, and a third inverter 136. One ends of the n-type MOS transistors 132 and 134 are grounded, and the other ends thereof are electrically connected to the first ferroelectric capacitor 122 and the second ferroelectric capacitor 124, respectively. In other words, the n-type MOS transistors 132 and 134 control, based on potentials of their gates, as to whether or not the potentials on the one ends of the first ferroelectric capacitor 122 and the second ferroelectric capacitor 124 are to be brought to the ground potential. Also, the third inverter 136 inverts the logical value of the connection control signal RE supplied, and supplies the same to the gates of the n-type MOS transistors 132 and 134.

The connecting section 140 controls, based on the potential of the connection control signal RE, as to whether or not the flip-flop 110 and the storage section are to be electrically connected. In other words, the connecting section 140 controls as to whether or not the first ferroelectric capacitor 122 is to be electrically connected to the first terminal 116, and the second ferroelectric capacitor 124 to the second terminal 118.

In the present embodiment, the connecting section 140 is composed of n-type MOS transistors 142 and 144. The n-type MOS transistor 142 has one of its source and drain electrically connected to the first ferroelectric capacitor 122, and the other electrically connected to the first terminal 116. The n-type MOS transistor 142 controls, based on the potential on its gate, as to whether or not the first ferroelectric capacitor 122 is to be electrically connected to the first terminal 116. Also, the n-type MOS transistor 144 has one of its source and drain electrically connected to the second ferroelectric capacitor 124, and the other electrically connected to the second terminal 118. The n-type MOS transistor 144 controls, based on the potential on its gate, as to whether or not the second ferroelectric capacitor 124 is to be electrically connected to the second terminal 118.

The writing section 150 writes memory data in the flip-flop 110, based on potentials of a write control signal IE and a write data IN. The writing section 150 has a structure having a fourth inverter 152, and a transfer gate 154. The fourth inverter 152 receives the write control signal E as an input, and supplies an inverted signal of the write control signal IE to the gate of a p-type MOS transistor composing the transfer gate 154. The transfer gate 154 has one end that is supplied with the write data IN, and the other end that is electrically connected to the first terminal 116. Also, the write control signal IE is supplied to the gate of an n-type MOS transistor composing the transfer gate 154. In other words, the writing section 150 controls, based on the potential of the write control signal IE, as to whether or not the write data IN is to be supplied to the first terminal 116, thereby controlling the potential on the first terminal 116. By this, predetermined memory data can be written in the flip-flop 110.

The output section 160 outputs, based on the potential of a read control signal OE, an output signal OUT indicating the memory data written in the flip-flop 110. In the present embodiment, the output section 160 is composed of a fifth inverter 162, a transfer gate 164, and a NAND circuit 166.

The fifth inverter 162 receives the read control signal OE as an input, and supplies an inverted signal of the read control signal OE to the gate of a p-type MOS transistor composing the transfer gate 164. The transfer gate 164 has its one end electrically connected to the second terminal 118, and the other end electrically connected to one of the input terminal of NAND circuit 166. Also, the read control signal OE is supplied to the gate of an n-type MOS transistor composing the transfer gate 164. The NAND circuit 166 outputs a negative logical product of the read control signal OE and the potential on the other terminal of the transfer gate 164 as an output signal OUT.

4. Operation of Program Circuit

Figure 5:
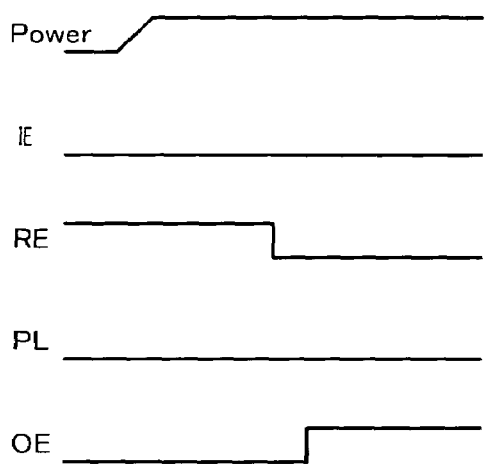
FIG. 5 including
Figure 5:
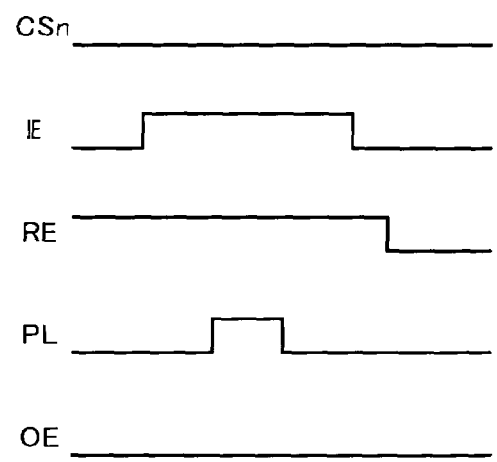

FIG. 5 is a timing chart indicating operations of the program circuit PGn described above. Each of the control signals in the present embodiment is a digital signal indicating a logical H or a logical L. The potential of each control signal, when the control signal indicates a logical H, is generally at the same potential as that of the driving voltage $V_{cc}$ of the program circuit PGn. Also, the potential of each control signal, when the control signal indicates a logical L, is at a ground potential, in other words, 0V.

4-1. Reading Operation

Referring to FIG. 5(A), an operation to read an output signal by the program circuit PGn is described. It is assumed here that data "0" is written in the first ferroelectric capacitor 122, and data "1" is written in the second ferroelectric capacitor 124. In other words, the first ferroelectric capacitor 122 has a capacity $C_0$ based on its paraelectric characteristic, and the second ferroelectric capacitor 124 has a capacity $C_1$ that is greater than the capacity $C_0$ as a capacity based on its paraelectric characteristic.

First, in an initial state, the connection control signal RE from the control circuit CT indicates a logical H. Accordingly, the n-type MOS transistors 142 and 144 are conductive, such that the first terminal 116 and the ferroelectric capacitor 122 are electrically connected, and the second terminal 118 and the second ferroelectric capacitor 124 are also electrically connected. In other words, the capacity $C_0$ is appended to the first terminal 116 by the first ferroelectric capacitor 122, and the capacity $C_1$ is appended to the second terminal 118 by the second ferroelectric capacitor 124.

When feeding of a power supply voltage to the flip-flop 110 is started, the power supply voltage supplied to the first inverter 112 and the second inverter 114 gradually rises. Also, because the input potential on the first inverter 112 and the second inverter 114 is 0V at this moment, the output potential on the first inverter 112 and the second inverter 114 also rises with the rise of the power supply voltage. In other words, the potential on the first terminal 116 and the second terminal 118 rises. It is noted here that the power supply voltage is a voltage of the power supply that operates the flip-flop 110, which is, for example, a driving voltage $V_{cc}$.

At this moment, the capacity $C_0$ is appended by the first ferroelectric capacitor 122 to the first terminal 116, and the capacity $C_1$ that is greater than the capacity $C_0$ is appended by the second ferroelectric capacitor 124 to the second terminal 118. In other words, to raise the potential on the first terminal 116 and the second terminal 118, the capacities $C_0$ and $C_1$ need to be charged. In the present embodiment, because a greater capacity is appended to the second terminal 118 than to the first terminal, the potential on the first terminal 116 rises quicker than the potential on the second terminal 118. Accordingly, the potential on the first terminal 116 reaches a threshold voltage (Vt) of the first inverter 112 and the second inverter 114 earlier than the potential on the second terminal 118 does. It is noted here that the threshold voltage Vt of an inverter is a voltage at which the logical value of an output of the inverter changes.

When the potential on the first terminal 116 reaches the threshold voltage Vt, the output of the first inverter 112 changes to a logical L. Accordingly, when the potential on the first terminal 116 reaches the threshold voltage Vt, the potential on the second terminal 118 falls to 0V. Also, when the potential on the second terminal 118 falls to 0V, the output from the second inverter 114 would change to a logical H. Accordingly, when the potential on the first terminal 116 reaches the threshold voltage Vt, the potential on the first terminal 116 becomes to be generally the same potential of the power supply voltage. By this, the flip-flop 110 retains memory data in which the potential on the first terminal 116 is a logical H, and the logical value on the second terminal 118 is a logical L. By the operations described above, memory data stored in the storage section 120 is read out, and the memory data is retained on the flip-flop 110.

Next, the control circuit CT changes the read control signal OE to a logical H, thereby making the transfer gate 164 conductive. By this, the NAND circuit 166 outputs an output signal OUT indicating the memory data that is retained by the flip-flop 110. In other words, the output section 160 outputs a logical H as a logical value indicating the memory data, because the logical value on the second terminal 118 is a logical L. It is noted that, in the present embodiment, the logical value of the output signal OUT is continuously maintained at a logical H, because the logical value of the output signal OUT before the read control signal OE is changed to a logical H is also a logical H. By the operation described above, the memory data retained by the flip-flop 110 is outputted from the output section 160 as the output signal OUT, and outputted to the exclusive OR circuit EX1 or EX2. The operation of the control circuit CT is started upon detection of the power supply being turned ON, such that a signal to start the control circuit is not required to be separately generated.

While the output section 160 is outputting the output signal OUT indicating the memory data, the storage section 120 may preferably be electrically cut off from the flip-flop 110. In the present embodiment, the control circuit CT changes the connection control signal RE to a logical L to make the n-type MOS transistors 142 and 144 nonconductive, thereby electrically cutting off the storage section 120 from the flip-flop 110. Also, when the connection control signal RE changes to a logical L, the n-type MOS transistors 132 and 134 become conductive. Accordingly, one ends of the first ferroelectric capacitor 122 and the second ferroelectric capacitor 124 are grounded, such that their potential becomes to be 0V. Also, because the storage control signal PL is also at a logical L, the potential on the other ends of the first ferroelectric capacitor 122 and the second ferroelectric capacitor 124 becomes to be 0V. Accordingly, the voltage applied to the first ferroelectric capacitor 122 and the second ferroelectric capacitor 124 becomes to be generally 0V.

In this manner, the program circuit PGn can output a signal OUT that is different based on data stored in the ferroelectric capacitors 122 and 124. Accordingly, by storing predetermined data in the ferroelectric capacitors in advance, a desired signal can be outputted.

4-2. Writing Operation

Next, referring to FIG. 5(B), a writing operation for storing desired memory data in the storage section 120, which is conducted in a stage before laminating layers, is described. In an example described below, an operation to store memory data, that is different from memory data stored in the storage section 120, in the storage section 120, in other words, an operation to write data "1" in the first ferroelectric capacitor 122, and data "0" in the second ferroelectric capacitor 124, is described.

First, in a state in which the storage section 120 and the flip-flop 110 are electrically connected (i.e., a state in which the connection control signal RE is at a logical H), the write control signal IE from the programming pad PE is changed to a logical H, thereby making the transfer gate 154 conductive. Then, by changing the potential of the write data IN from the chip selection pad CSn to 0V, the potential on the first terminal 116 is brought to 0V. By this, the output of the first inverter 112 becomes to be a logical H, such that the potential on the second terminal 118 becomes to be $V_{cc}$ and the output of the second inverter 114 becomes to be a logical L.

At this moment, because the logical value of the storage control signal PL is a logical L, in other words, because the potential on the other end of the second ferroelectric capacitor 124 is 0V, the voltage applied to the second ferroelectric capacitor 124 becomes to be $V_{cc}$. Accordingly, data "0" is written anew in the second ferroelectric capacitor 124.

Next, the control circuit CT changes the storage control signal PL to a logical L, in other words, it changes the potential on the other ends of the first ferroelectric capacitor 122 and the second ferroelectric capacitor 124 to $V_{cc}$. At this moment, because the potential on the one end of the first ferroelectric capacitor 122 is 0V, the voltage applied to the first ferroelectric capacitor 122 becomes to be $-V_{cc}$. Accordingly, data "1" is written anew in the first ferroelectric capacitor 122. On the other hand, the voltage applied to the second ferroelectric capacitor 124 is almost 0V. Accordingly, the data "0" written in the second ferroelectric capacitor 124 is continuously retained as it is. By the operation described above, according to the write data IN from the chip selection pad PE, memory data that is different from the memory data retained at the flip-flop 110 is stored anew in the storage section 120. The operation of the control circuit CT is started upon detecting the signal from the programming pad PE, such that a signal to start the control circuit does not need to be separately generated.

In accordance with the present embodiment, due to the fact that the program circuit is formed with a nonvolatile memory cell, steps of melting fuses or the like for programming are not required. Also, due to that fact that ferroelectric capacitors are used as a nonvolatile memory cell, the circuit is rewritable, such that data can be rewritten even when erroneously programmed, before lamination. Rewriting after lamination is described below in a second embodiment.

Referring back to FIG. 2, it is understood that the write control signals IE for writing in the program circuits PG1 and PG2 are both supplied by the programming pad PE. It is also understood that the write data IN to the program circuit PG1 or PG2 is a logical product of the signal from the chip selection pad CS1 or CS2 and the signal from the programming pad PE.

The chip selection pads CS1 and CS2 are pads for inputting chip selection signals after the chips have been laminated. However, in this embodiment, they are also used as data input pads in a writing stage of writing in the program circuits PG1 and PG2 (before the chips are laminated in this embodiment). As a result, the pads are effectively used, and the number of the pads can be reduced to a minimum.

Also, even when a plurality of program circuits PG1 and PG2 are provided, the programming pad PE can be connected to both of these program circuits PG1 and PG2, such that only one programming pad PE may be provided.

Furthermore, a logical product circuit with the programming pad PE is provided between the chip selection pad CS1 and the data IN input terminal of the program circuit. The programming pad PE is not used after lamination in the present embodiment (a logical L is maintained), such that, by taking a logical product with this pad, a signal would not be inputted in the program circuits PG1 and PG2. Accordingly, even when the chip selection pads CS1 and CS2 are used for chip selection after lamination, signals are prevented from being inputted in the program circuit, and therefore the power consumption can be suppressed.

It is noted that the program circuit is not limited to the one described above, and a variety of circuit structures can be implemented.

5. Relations Between Program Circuits and Chip Selection Signals

Next, relations between data written in the program circuits PG1 and PG2 on each of the chips and chip selection signals are described. For example, data "1" is written in both of the second ferroelectric capacitors of the program circuits PG1 and PG2 on the first chip C1. Data "0" and "1" are written in the second ferroelectric capacitors of the program circuits PG1 and PG2, respectively, on the second chip C2. Data "1" and "0" are written in the second ferroelectric capacitors of the program circuits PG1 and PG2, respectively, on the third chip C3. Data "0" is written in both of the second ferroelectric capacitors of the program circuits PG1 and PG2 on the fourth chip C4.

Among the four chips, when the first chip C1 is to be selected, a chip selection signal at a logical H is inputted in both of the chip selection pads CS1 and CS2. Then, the chip selection signal matches outputs of the program circuits PG1 and PG2, such that a chip enable signal that is inputted in the chip enable pad CE becomes active at the first chip C1. The signals do not match for the other chips, such that they are put in a standby state.

Similarly, when the second chip C2 is to be selected, chip selection signals at a logical L and a logical H are inputted in the chip selection pads CS1 and CS2, respectively. Then, the chip selection signals match outputs of the program circuits PG1 and PG2, such that a chip enable signal becomes active at the second chip C2.

Similarly, when the third chip C3 is to be selected, chip selection signals at a logical H and a logical L are inputted in the chip selection pads CS1 and CS2, respectively. Then, the chip selection signals match outputs of the program circuits PG1 and PG2, such that a chip enable signal becomes active at the third chip C3.

Similarly, when the fourth chip C4 is to be selected, chip selection signals at a logical L are inputted in both of the chip selection pads CS1 and CS2. Then, the chip selection signals match outputs of the program circuits PG1 and PG2, such that a chip enable signal becomes active at the fourth chip C4.

It is noted that when the chip enable signal is at a logical L, this is inputted in the NAND gate G2 of the chip selection judging circuit 10, such that all of the chips are put in a standby state regardless of the chip selection signal.

In this manner, by laminating the chips C1–C4 equipped with four kinds of memory patterns, each of the chips can be identified. Which one of the memory patterns is to be disposed on which one of the chips can be optionally decided. However, if identical memory patterns are laminated, chips cannot be identified.

If only three of the four memory patterns described above are used, and only three chips are laminated, there are only three chip selection signals that correspond to these three memory patterns. Accordingly, a chip selection signal that does not correspond to any of these chips means that all of the chips are put in a standby state. Accordingly, when there are only three chips, the chip enable signal described above becomes unnecessary, and the chip enable pad CE and the NAND gate G2 in the last stage of the chip selection judging circuit 10 on each of the chips become unnecessary. When the chip enable pad CE is made unnecessary by the method described above, n pieces of pads (n is an integer of 2 or more) may be provided for each chip, and a maximum of $(2^{n-1})$ pieces of chips may be laminated and each of the chips can be driven.

6. Second Embodiment

Figure 6:
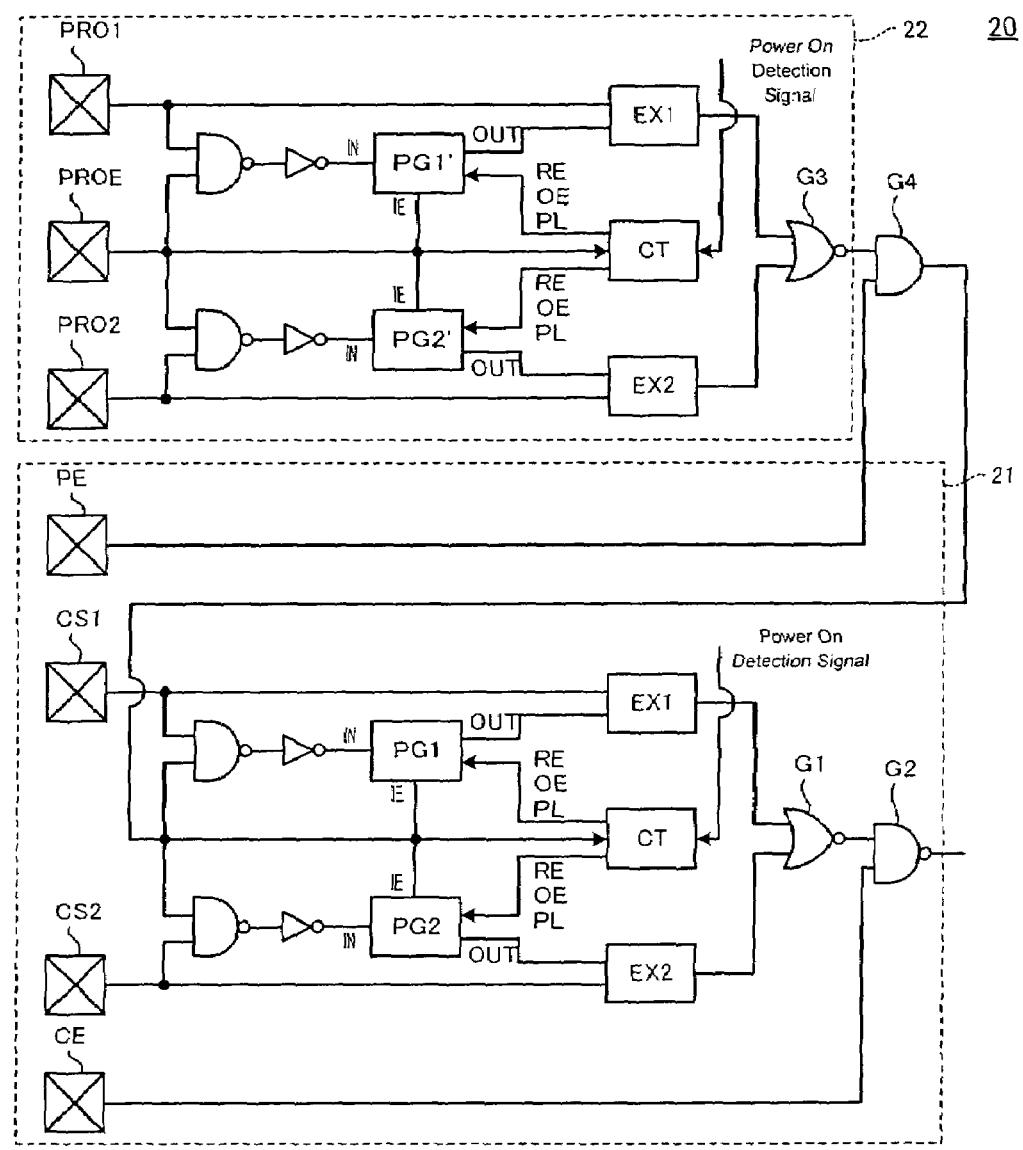
FIG. 6 is a circuit diagram of a chip selection judging circuit provided on each chip of a semiconductor memory device in accordance with a second embodiment of the present invention.

FIG. 6 is a circuit diagram of a chip selection judging circuit provided on each chip of a semiconductor memory device in accordance with a second embodiment of the present invention. With this semiconductor memory device, data in the program circuits PG1 and PG2 can be modified even after chips are laminated and the corresponding pads are shared. More specifically, a chip selection judging complex circuit 20 shown in FIG. 6 is composed of a complex circuit in which an AND gate G4, with a second chip selection judging circuit 22, is provided in a stage after a programming pad PE of a first chip selection judging circuit 21, which corresponds to the chip selection judging circuit 10 in FIG. 2. Also, chip selection pads PRO1 and PRO2, and a programming pad PROE are added.

With such a structure, when chip selection signals corresponding to program circuits PG1' and PG2' of the second chip selection judging circuit 22 are applied to the chip selection pads PRO1 and PRO2, a NOR gate G3 of the second chip selection judging circuit 22 of the selected chip outputs a logical H. By making a logical product of this logical H with an input to the programming pad PE, a target chip can be specified even after lamination. In this state, desired signals may be given to the chip selection pads CS1 and CS2, such that the program circuits PG1 and PG2 can be rewritten.

In ordinary operations other than rewriting the program circuits PG1 and PG2, data in the program circuits PG1 and PG2 are merely referred to, and therefore the second chip selection judging circuit 22 is not used. The chip selection pads PRO1 and PRO2, the programming pad PROE, and the programming pad PE are not used, either, and therefore they may preferably be fixed at a logical L.

It is noted that, at the time of writing before mounting, first, the chip selection pads PRO1 and PRO2 and the programming pad PROE are used to write in the program circuits PG1' and PG2'. Then, by inputting programmed values in the chip selection pads PRO1 and PRO2 to make an input to the programming pad PE effective, writing to the program circuits PG1 and PG2 becomes possible.

In accordance with the present embodiment, the program circuits PG1 and PG2 can be rewritten even after lamination. Therefore, for example, when the frequency of use is different for each of the chip numbers, the chip numbers may be changed after they are used for a predetermined period of time, such that the service life of a semiconductor memory device can be extended. Also, even when data in the PG1 and PG2 identical to those on another chip are laminated and mounted, the PG1 and PG2 can be corrected afterward.

7. Examples of Electronic Apparatus

Figure 7:
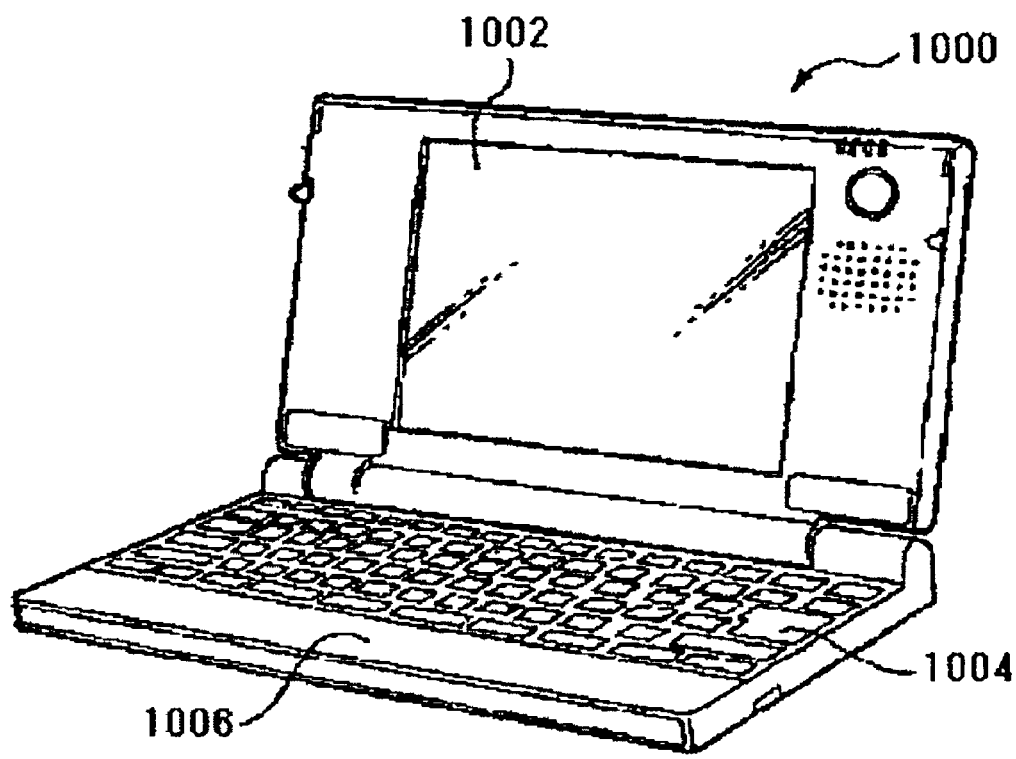
FIG. 7 is a perspective view showing a structure of a personal computer, which is an example of an electronic apparatus in accordance with an embodiment of the present invention.

FIG. 7 is a perspective view showing a structure of a personal computer 1000, which is an example of an electronic apparatus in accordance with an embodiment of the present invention. In FIG. 7, the personal computer 1000 is structured with a display panel 1002 and a main body 1006 having a keyboard 1004. As a storage medium, in particular, as a nonvolatile memory of the main body 1006 of the personal computer 1000, a laminated type semiconductor memory device in accordance with the present invention is used. For this reason, electronic apparatuses equipped with a storage means having a small area and a large capacity can be provided at low costs.

Also, the present invention is not limited to the electronic apparatus described above, and can be applied to all electronic apparatuses equipped with ferroelectric memory devices, such as, IC cards, portable information devices, home electric appliances, and the like.

The embodiment examples and application examples described above with reference to the embodiments of the present invention may be appropriately combined depending on the usages, or may be used with changes and/or improvements added thereto. The present invention is not limited to the descriptions of the embodiments above. It is clear from the description in the scope of patent claims that modes created by such combinations, changes and/or improvements can be included in the technical scope of the present invention.

What is claimed is:

1. A semiconductor memory device having a plurality of semiconductor chip layers laminated, the semiconductor memory device comprising:
   a chip selection pad provided on each of the chip layers, the chip selection pads mutually connected across the chip layers such that a chip selection signal for selecting each of the chip layers is commonly inputted in each of the chip layers,
   wherein each of the chip layers is equipped with
   a program circuit equipped with a writable nonvolatile memory cell, and a logical circuit that is connected to the nonvolatile memory cell and outputs a signal that is different according to a recoded content in the nonvolatile memory cell, and
   a chip selection judging circuit that judges a chip selection based on the chip selection signal and an output signal of the program circuit.

2. A semiconductor memory device according to claim 1, wherein the nonvolatile memory cell is capable of rewriting the recorded content after writing.

3. A semiconductor memory device according to claim 2, wherein the program circuit is equipped with
   a flip-flop having a first terminal and a second terminal,
   a first ferroelectric capacitor that gives a first capacity to the first terminal,
   a second ferroelectric capacitor that gives a second capacity different from the first capacity to the second terminal, and
   a voltage source that supplies a drive voltage for driving the flip-flop to the flip-flop in which the first capacity and the second capacity are given to the first terminal and the second terminal.

4. A semiconductor memory device according to claim 3, wherein each of the chip layers is equipped with a control circuit that detects a starting of a power supply and controls a signal output from the first terminal or the second terminal of the flip-flop.

5. A semiconductor memory device according to claim 1, wherein
   each of the chip layers is equipped with a plurality of the chip selection pads and a plurality of the program circuits, and is further equipped with a programming pad that receives a write control signal for writing in the nonvolatile memory cell,
   each of the program circuits is equipped with a write data receiving terminal that receives data to be recorded in the nonvolatile memory cell, and a write control signal receiving terminal that receives the write control signal from the programming pad, and
   the plurality of the chip selection pads are connected to the write data receiving terminals of the plurality of program circuits, respectively.

6. A semiconductor memory device according to claim 5, wherein
   each of the chip layers is equipped with a control device that detects the write control signal from the programming pad and executes a control to write in the nonvolatile memory cell.

7. A semiconductor memory device according to claim 5, wherein
   each of the chip selection pads is connected to the write data receiving terminal via a logical product circuit formed with the control signal from the programming pad.

8. A semiconductor memory device according to claim 5, wherein
   each of the chips is further equipped with a second chip selection judging circuit, and
   the programming pad is connected to the write control signal receiving terminal through a logical product circuit formed with the second chip selection judging circuit.

9. An electronic apparatus characterized in comprising the semiconductor memory device recited in claim 1.

* * * * *